(12) United States Patent
Kohler et al.

(10) Patent No.: US 8,156,402 B2
(45) Date of Patent: Apr. 10, 2012

(54) MEMORY DEVICE WITH ERROR CORRECTION CAPABILITY AND EFFICIENT PARTIAL WORD WRITE OPERATION

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 1133 days.

(21) Appl. No.: 11/994,740

(22) PCT Filed: Apr. 26, 2007

(86) PCT No.: PCT/US2007/067502
§ 371 (c)(1),
(2), (4) Date: Jan. 4, 2008

(87) PCT Pub. No.: WO2008/133678
PCT Pub. Date: Nov. 6, 2008

(65) Prior Publication Data
US 2010/0131825 A1    May 27, 2010

(51) Int. Cl.
*G11C 29/00* (2006.01)
*G11C 7/00* (2006.01)
*G06F 13/00* (2006.01)

(52) U.S. Cl. ........ 714/763; 714/764; 714/767; 711/154; 365/189.02; 365/189.04; 365/201

(58) Field of Classification Search ................. 714/763, 714/764, 767; 711/154; 365/189.02, 189.04, 365/201
See application file for complete search history.

(56) References Cited

U.S. PATENT DOCUMENTS

| | | | |
|---|---|---|---|
| 5,202,969 A | 4/1993 | Sato et al. | |
| 5,459,842 A | 10/1995 | Begun et al. | |
| 5,787,454 A * | 7/1998 | Rohlman | 711/5 |
| 5,894,437 A | 4/1999 | Chang et al. | |
| 6,651,208 B1 * | 11/2003 | Tran et al. | 714/755 |
| 7,116,585 B2 * | 10/2006 | Vernenker et al. | 365/189.05 |
| 7,124,348 B2 | 10/2006 | Nicolaidis | |
| 7,257,762 B2 * | 8/2007 | Holm et al. | 714/763 |
| 2003/0081449 A1 * | 5/2003 | Beucler | 365/154 |

FOREIGN PATENT DOCUMENTS
WO PCT/US2007/067502    12/2007
* cited by examiner

*Primary Examiner* — John J Tabone, Jr.
(74) *Attorney, Agent, or Firm* — Ryan, Mason & Lewis, LLP

(57) ABSTRACT

A memory device comprises a memory array and error correction circuitry coupled to the memory array. The memory device is configured to perform at least a partial word write operation and a read operation, with the partial word write operation comprising a read phase and a write phase. The write phase of the partial word write operation occurs in the same clock cycle of the memory device as the read operation by, for example, time multiplexing bitlines of the memory array within the clock cycle between the write phase of the partial word write operation and the read operation. Thus, the partial word write operation appears to a higher-level system incorporating or otherwise utilizing the memory device as if that operation requires only a single clock cycle of the memory device.

24 Claims, 6 Drawing Sheets

102

PARTIAL WORD WRITE OPERATION

*FIG. 6*

| | EXTERNAL MEMORY CYCLE | | | |
|---|---|---|---|---|
| | CYCLE 1 | CYCLE 2 | CYCLE 3 | |
| CASE 1 | PARTIAL WORD WRITE — READ PHASE / WRITE PHASE | READ | | } EXTERNAL CYCLE 1<br>} EXTERNAL CYCLE 2 |
| CASE 3 | PARTIAL WORD WRITE — READ PHASE / WRITE PHASE | READ PHASE / WRITE PHASE — PARTIAL WORD WRITE | | } EXTERNAL CYCLE 1<br>} EXTERNAL CYCLE 2<br>} EXTERNAL CYCLE 3 |
| CASE 4 | PARTIAL WORD WRITE — READ PHASE / WRITE PHASE | NOOP | | |
| CASE 2 | PARTIAL WORD WRITE — READ PHASE / WRITE PHASE | WRITE | WRITE | } EXTERNAL CYCLE 1<br>} EXTERNAL CYCLE 2<br>} EXTERNAL CYCLE 3<br>} EXTERNAL CYCLE 4 |
| CASE 2 | PARTIAL WORD WRITE — READ PHASE / WRITE PHASE | WRITE | READ | |
| CASE 2 | PARTIAL WORD WRITE — READ PHASE / WRITE PHASE | WRITE | READ PHASE / WRITE PHASE — PARTIAL WORD WRITE | |

MEMORY DEVICE WITH ERROR CORRECTION CAPABILITY AND EFFICIENT PARTIAL WORD WRITE OPERATION

FIELD OF THE INVENTION

The present invention relates generally to semiconductor memory devices, and more particularly to memory devices which incorporate error correction capability.

BACKGROUND OF THE INVENTION

Semiconductor memory devices are subject to defects that may cause some memory cells to be read with incorrect data. Such defects are generally discovered during post-manufacture testing of integrated circuit memory devices. Defective memory devices may need to be discarded, thereby reducing the yield of the integrated circuit manufacturing process, and increasing the net manufacturing costs for the non-defective devices.

A number of techniques are known for configuring a memory device to remain operative in the presence of defects. One such technique involves incorporating redundant lines, rows or blocks of cells into the device. This allows lines, rows or blocks having defective cells to be replaced with corresponding non-defective redundant elements. Volatile or non-volatile switching elements may be used to implement the replacement.

Another technique for dealing with defects in memory devices involves utilizing error correction coding (ECC) to correct data errors attributable to defects. Examples of this type of approach are disclosed in U.S. Patent Application Publication No. 2006/0048031, entitled "Built-In Self-Test for Memory Arrays Using Error Correction Coding," which is commonly assigned herewith and incorporated by reference herein.

It is generally desirable to support partial word write operations on memory devices that include error correction capability. A partial word write operation occurs when one or more, but not all, of the bits in a dataword are to be written. The remaining bits in the dataword are not changed but remain at their previous values. Examples of partial word write operations include byte write operations and bit write operations.

Memory devices that incorporate ECC typically require two cycles of an external clock to perform a partial word write operation, namely, a first cycle for a read phase of the partial word write operation and a second cycle for a write phase of the partial word write operation. Requiring two clock cycles is disadvantageous because it slows down the data transfer rate between the memory device and a higher-level system that incorporates or otherwise utilizes that device. For example, the external cycle time specification for the memory device, and thus its external clock frequency, may be reduced by a factor of two to allow time for the two cycles to occur internally to the device. Unfortunately, this approach slows the data transfer rate by a factor of two. Alternatively, two external cycles may be used to perform a given partial word write operation. However, this approach also slows the data transfer rate by a factor of two, by requiring a no-operation (NOOP) cycle following the cycle that initiates the partial word write operation.

A number of techniques are known in the art for reducing the time needed to perform a partial word write operation in a memory device that incorporates ECC. These techniques generally allow the write phase of the partial word write operation to be accomplished in a time somewhat shorter than a full cycle, and thus the partial word write operation can be executed in somewhat less than two cycles.

One such technique is disclosed in U.S. Patent Application Publication No. 2006/0112321, entitled "Transparent Error Correcting Memory That Supports Partial-Word Write," which is incorporated by reference herein. This technique involves keeping particular sense amplifiers and rows of the memory device active from the read phase through the write phase, whereas normally they would have been deactivated at the end of the read phase and reactivated at the beginning of the write phase.

Another technique for reducing the time needed to perform a partial word write operation is referred to as predictive ECC, and is described in U.S. Patent Application Publication No. 2006/0123322, entitled "Predictive Error Correction Code Generation Facilitating High-Speed Byte-Write in a Semiconductor Memory," which is incorporated by reference herein. This technique allows ECC decode of a read dataword to be performed at the same time as ECC encode of the dataword to be written, thereby reducing the overall time required to complete the partial word write operation.

However, both these techniques still require an elapsed time substantially greater than one clock cycle to complete the partial word write operation.

Accordingly, a need exists for an improved approach to performing partial word write operations in memory devices with error correction capability.

SUMMARY OF THE INVENTION

The present invention in one or more illustrative embodiments provides techniques for improving the efficiency of partial word write operations in a memory device having error correction capability.

In accordance with one aspect of the invention, a memory device comprises a memory array and error correction circuitry coupled to the memory array. The memory device is configured to perform at least a partial word write operation and a read operation, with the partial word write operation comprising a read phase and a write phase. The write phase of the partial word write operation occurs in the same clock cycle of the memory device as the read operation by, for example, time multiplexing bitlines of the memory array within the clock cycle between the write phase of the partial word write operation and the read operation. More specifically, during a first portion of the clock cycle, write data to be written to a first one of the memory cells as part of the partial word write operation is carried by a given bitline of the memory array, and during a second portion of the clock cycle, read data read from a second one of the memory cells as part of the read operation is also carried by the given bitline. The read operation may be, for example, a read phase of another partial word write operation.

In an illustrative embodiment, the memory cells are arranged in a plurality of sub-blocks having respective sets of local bitlines, with the local bitlines being coupled to a set of global bitlines shared by the plurality of sub-blocks. The global bitlines are time multiplexed within the clock cycle between the write phase of the partial word write operation and the read operation. For example, during a first portion of the clock cycle the global bitlines are dedicated for use with write data for the partial word write operation, and during a second portion of the clock cycle the global bitlines are dedicated for use with read data for the read operation.

As a more specific example, the time multiplexing of the global bitlines may be configured such that in the clock cycle the global bitlines are first utilized to move write data from a data input to a first set of local sense amplifiers, coupled to respective ones of a first set of local bitlines of a first one of the sub-blocks, for latching as part of the write phase of the partial word write operation. After the write data is latched in the first set of local sense amplifiers, the global bitlines are then utilized to move read data previously latched in a second set of local sense amplifiers, coupled to respective ones of a second set of local bit lines of a second one of the sub-blocks, to the error correction circuitry as part of the read operation.

A memory device in accordance with the invention may be implemented, for example, as a stand-alone memory device, such as a packaged integrated circuit, or as an embedded memory in a processor or other device.

Advantageously, partial word write operations in the illustrative embodiment can appear to a higher-level system incorporating or otherwise utilizing the memory device as if those operations each require only a single clock cycle of the memory device. The data transfer rate of the memory device is therefore not reduced when using, for example, partial word write operations in conjunction with subsequent read operations.

BRIEF DESCRIPTION OF THE DRAWINGS

FIG. 6 is a diagram illustrating exemplary sequences of operations across multiple cycles in the semiconductor memory device of FIG. 1.

DETAILED DESCRIPTION OF THE INVENTION

The invention will be illustrated herein in conjunction with exemplary semiconductor memory devices and associated error correction circuitry. It should be understood, however, that the invention is more generally applicable to any semiconductor memory device, and may be implemented using error correction circuitry other than that specifically shown in conjunction with the illustrative embodiments.

Figure 1:
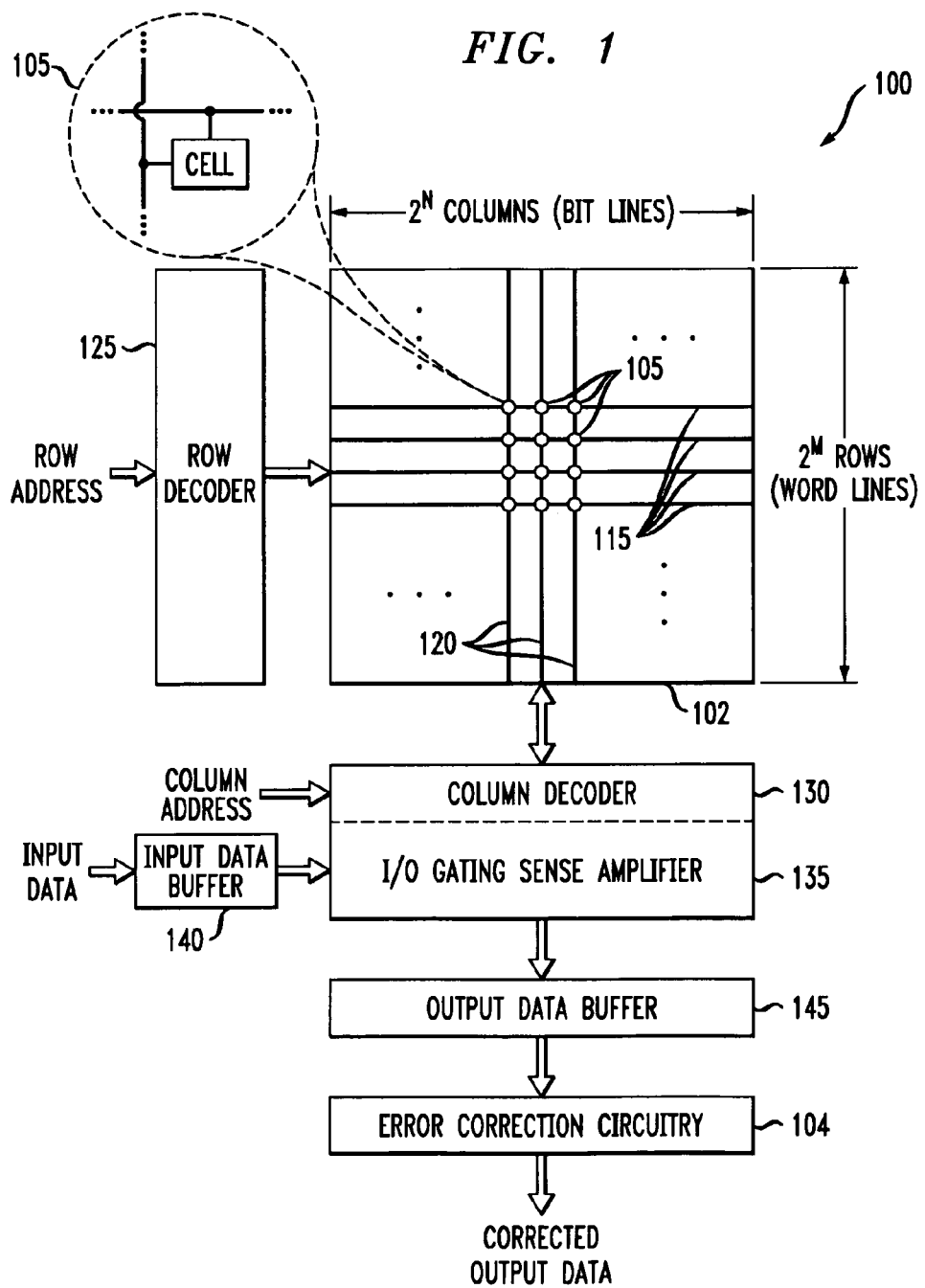
FIG. 1 shows a semiconductor memory device with error correction circuitry in an illustrative embodiment of the invention.

FIG. 1 shows a simplified diagram of a memory device 100 in accordance with an illustrative embodiment of the invention. The memory device 100 comprises a memory array 102 and error correction circuitry 104 coupled to the memory array. The memory array comprises a plurality of memory cells 105 configured to store data. The memory cells may each be configured to store a single bit of data, and such memory cells are also referred to herein as bit-cells. Each cell 105 is coupled to a corresponding row or wordline 115 and column or bitline 120. Particularly ones of the cells can be activated for reading or writing of data therefrom by application of appropriate row and column addresses to respective row decoder 125 and column decoder 130. Other elements of the memory device 100 include a gating and sense amplifier element 135, an input data buffer 140 and an output data buffer 145. The manner in which data can be written to and read from the cells 105 of the array is well understood in the art and will not be described in detail herein.

Figure 2:
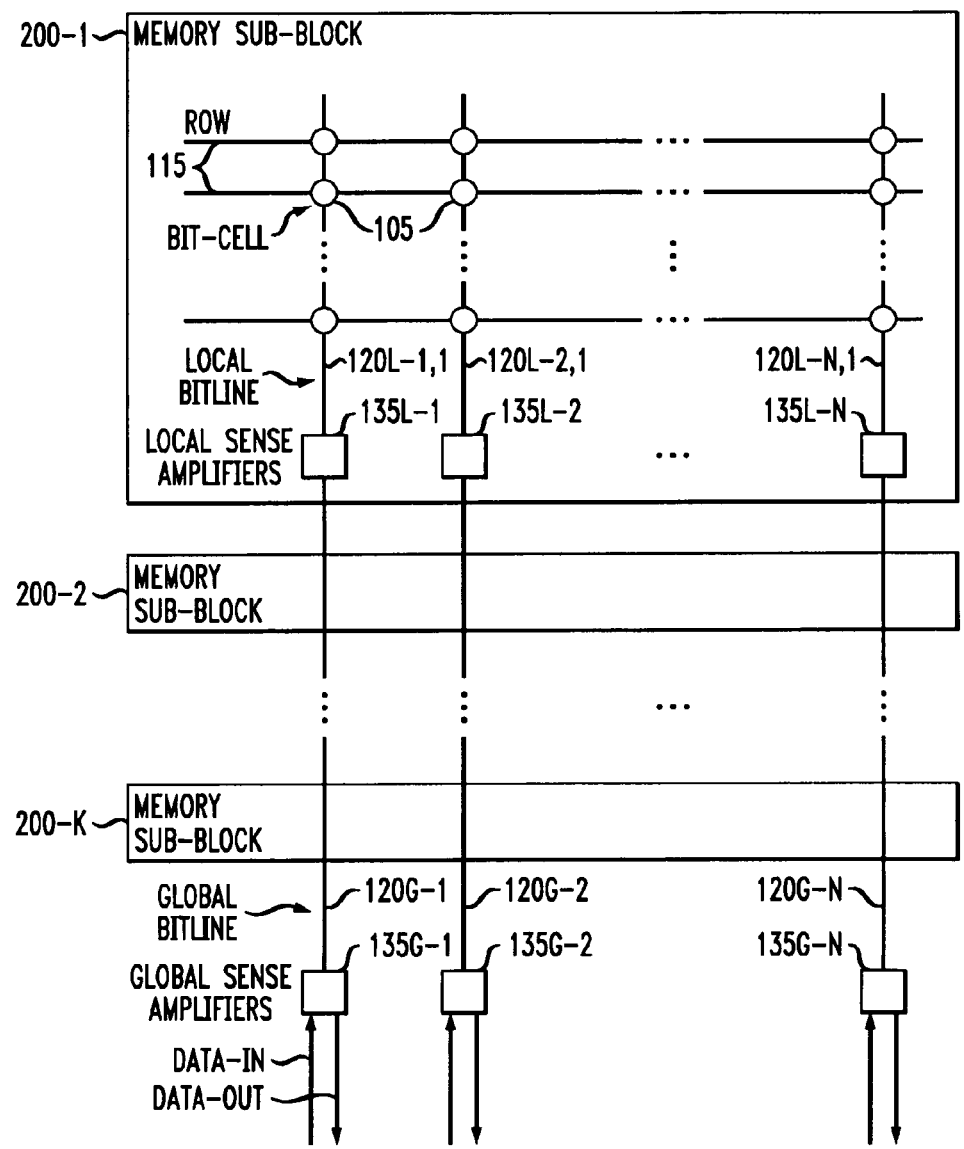
FIG. 2 is a more detailed view of one possible implementation of a memory array of the semiconductor memory device of FIG. 1.

Although memory array 102 is identified in FIG. 1 as comprising the cells 105 and their associated wordlines and bitlines 115 and 120, the term "memory array" as used herein is intended to be broadly construed, and may encompass one or more associated elements such as input or output data buffers, column or row decoders, gating elements, sense amplifiers, etc. For example, as illustrated in FIG. 2, a given implementation of memory array 102 may comprise local and global sense amplifiers, such that element 135 is distributed throughout the array rather than configured as a separate element as shown in FIG. 1.

It should be noted that the memory device 100 may comprise many types of stand-alone or embedded memory, including static or dynamic random access memory (SRAM or DRAM), electrically erasable programmable ROM (EEPROM), magnetic RAM (MRAM), ferroelectric RAM (FRAM), phase-change memory, etc. The invention is thus not limited in terms of the particular storage or access mechanism utilized in the memory device.

The error correction circuitry 104 in this embodiment performs error detection and correction utilizing conventional ECC. The error correction circuitry as shown receives output data from output data buffer 145. This output data may comprise, for example, one or more stored codewords retrieved by applying an appropriate read address comprising row and column addresses to the respective row and column decoders 125 and 130. The particular type of ECC used in a given embodiment is not critical, and any of a wide variety of well-known types of ECC may be used in implementing the invention. Circuitry for generating the codewords from input data is not explicitly shown, but may be implemented in a conventional manner, as will be appreciated by those skilled in the art.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. More specifically, as previously indicated, the invention can be implemented using many types of memory, and is not limited to any particular memory device configuration. Those skilled in the art will recognize that a wide variety of other memory device configurations may be used in implementing the invention.

The memory device 100 in the illustrative embodiment is configured to support a plurality of operations, including a read operation, a full word write operation, a partial word write operation and no-operation (NOOP). Other types of operations can be supported in alternative embodiments of the invention.

As indicated previously, conventional memory devices are deficient in that such devices generally require an elapsed time substantially greater than one clock cycle to complete the partial word write operation. The illustrative embodiment overcomes this deficiency of the prior art by configuring the memory such that a write phase of a partial word write operation in the memory device occurs in the same clock cycle as a read operation in the memory device. Thus, the write phase of the partial word write operation occurs substantially simultaneously with the read operation. This is achieved in the illustrative embodiment by time multiplexing of global bitlines between the write phase of the partial word write operation and a read operation.

It should be noted that the read operation may comprise, for example, the read phase of another partial word write operation, and thus the term "read operation" as used herein is intended to be broadly construed.

Using this bitline multiplexing technique, every clock cycle of the memory device can initiate a new operation, such that the partial word write operation in effect consumes only a single clock cycle. It will appear to a higher-level system incorporating or otherwise utilizing the memory device that partial word write operations can execute in the same cycle time as full word write operations, so that the data transfer rate will not be reduced during partial word write operations.

The manner in which the memory device 100 implements partial word write operations will be described herein with reference to FIGS. 2 through 6. By way of introduction, various aspects of illustrative ECC and associated read and write operations in the memory device 100 will initially be described.

The memory device 100 in the illustrative embodiment incorporates error correction based on ECC by associating a certain number of parity bits, collectively referred to as an ECC word, with each full dataword. For example, a 32-bit dataword may have an additional 6 ECC bits for single-bit error detect and correct (SEC), or an additional 7 ECC bits for single-bit error correct with double-bit error detect (SECDED). The 32-bit dataword and 6 or 7 bit ECC word are merged into a 38 or 39 bit codeword. As indicated previously, numerous alternative ECC arrangements may be used in other embodiments.

The memory device 100 is operated under the control of an external clock signal. Such a clock signal may be supplied to the memory device from a higher-level system, or from another suitable clock signal source. It is also possible that such a clock signal may be supplied from a source internal to the memory device. In the present embodiment, it is assumed that each cycle of this clock signal initiates and completes a particular memory operation, such as a read operation, a write operation or a NOOP operation. Clock cycles usually occur continuously and sequentially, and are also referred to herein as "external cycles" or simply "cycles." All such cycles are considered to be within the scope of the general term "clock cycle of the memory device" as that term is used herein.

During a read operation, the codeword comprising the merged dataword and ECC word is read from a memory location indicated by a read address. The codeword is then provided to the error correction circuitry 104. The error correction circuitry performs error detection and correction, and provides a corrected output dataword. Corrections are generally limited to one codeword bit being in error. Therefore valid data will be output from the memory device if there is no more than one bit in error in the codeword. Invalid data will be output if there is more than one bit in error in the codeword. A read operation occupies one full clock cycle of memory operation.

During a full word write operation, an ECC word is generated from a dataword. The ECC word may be generated, for example, in an ECC word calculator (ECCWC), which is not explicitly shown in FIG. 1. The dataword and ECC word are merged into the codeword which is then written into a memory location indicated by a write address. Like a read operation, a full word write operation occupies one full cycle of memory device operation.

As indicated previously, a partial word write is when one or more, but not all, of the bits in a dataword are to be written. The remaining bits in the dataword are not changed but remain at their previous values. In a memory device that does not have ECC, a partial word write is very similar to a full word write in that it is accomplished in a single cycle, but writing only some of the dataword bits. In a memory device that includes ECC, a partial word write operation normally requires two cycles. The first cycle is a read and correction of the pre-existing codeword as described above for a read operation. This read provides the corrected dataword which is to be modified by the selected bits to be written. This modified dataword is the new dataword. The second cycle comprises calculation of the new ECC word associated with the new dataword and the writing of the new codeword. The new dataword contains one or more bits from the original read operation and one or more new bits representing the partial word that is to be written. The new codeword is the merged new dataword and new ECC word. The two cycles of a typical partial word write operation in a memory device with ECC are more generally referred to herein as respective read and write phases of the partial word write operation.

Referring now to FIG. 2, an example of one possible implementation of the memory array 102 is shown. The portion of the memory array shown focuses on the codeword memory cells and their associated bitlines and datapaths. In this implementation, the memory array is separated into a plurality of memory sub-blocks 200-1, 200-2, . . . 200-K. Each of the sub-blocks encompasses a set of the memory cells 102 and their associated wordlines 115 and bitlines 120. Portions of the bitlines 120 are further classified as local bitlines 120L or global bitlines 120G. More specifically, the N local bitlines associated with a kth one of the K sub-blocks are denoted 120L-1,k, 120L-2,k, . . . 120L-N,k. Thus, for the first sub-block 200-1 of FIG. 2, its N local bitlines are denoted 120L-1,1, 120L-1,2, . . . 120L-1,N. The global bitlines are global to the full set of sub-blocks 200-1 through 200-K, and are denoted 120G-1, 120G-2, . . . 120G-N.

The sub-blocks 200 also include respective sets of local sense amplifiers, one coupled to each local bitline of a given sub-block. Thus, sub-block 200-1 includes local sense amplifiers 135L-1, 135L-2, . . . 135L-N coupled to respective ones of the bitlines of that sub-block.

Each of the global bitlines 120G-1, 120G-2, . . . 120G-N is coupled to a corresponding one of a set of global sense amplifiers 135G-1, 135G-2, . . . 135G-N. The global sense amplifiers provide input data to, and receive output data from, the respective global bitlines to which they are connected.

It should be noted that this figure is simplified for purposes of illustration, and does not show other memory device components such as data buffers and address decoders. Circuitry associated with ECC, such as the above-noted ECCWC and the error correction circuitry 104 is also omitted from the figure.

During a read operation, a particular row 115 is activated, and the corresponding memory cells 105 are coupled to their respective local bitlines 120L causing the states of the cells to be transferred onto the local bitlines. These states, or local bitline signals, are then detected and amplified by the local sense amplifiers 135L before being transferred onto the associated global bitlines 120G. The global bitline signals are detected and amplified by the global sense amplifiers 135G before being forwarded to other circuitry, such as the error correction circuitry 104. It should be noted that many sub-blocks may be associated with a given set of global bitlines. However, during any given cycle, only one row is active in one selected sub-block, that is, only one row is active along an entire set of global bitlines.

During a write operation, input data is presented to the global bitlines 120G through the global sense amplifiers 135G. From the global bitlines the input data is forwarded to the local bitlines 120L through the local sense amplifiers 135L. The selected row 115 in the selected sub-block 200 is then activated, thereby coupling the cells to their respective local bitlines for receiving and storing the data.

In the illustrative embodiment, the memory device 100 appears externally to only require one clock cycle for a partial word write operation. Internally, the partial word write operation stilt occupies two cycles, with its read phase occurring during the first cycle and its write phase occurring during the second cycle. However, the write phase is hidden from the user and is therefore not apparent external to the memory device. As indicated above, this is accomplished in the illustrative embodiment by time-multiplexing the global bitlines between the write phase of the partial word write operation and a read operation, where the read operation may be the read phase of another partial word write operation.

Assuming that the memory device 100 implements only the above-described read operation, full word write operation, partial word write operation and NOOP, there are four possible combinations of a partial word write operation followed by another operation:

1. Partial word write followed by a read
2. Partial word write followed by a write
3. Partial word write followed by another partial word write
4. Partial word write followed by a NOOP Because only one operation can occur within a sub-block 200 during any given single cycle, the partial word write must occur in a different sub-block from the following read, write, or partial word write operation. In cases where the memory device is requested to access the same sub-block for both the partial word write and the following operation, the memory device may delay the following operation by asserting an output flag requiring insertion of a NOOP cycle. Such a NOOP cycle is generally well received by a higher-level system in which the memory device is incorporated or otherwise utilized. Assertion of NOOP requests can be minimized by maximizing the number of sub-blocks and using other techniques known in the art, such as scrambling addresses so that sequential addressing jumps from sub-block to sub-block.

As noted above, a partial word write operation generally includes two distinct phases, namely, a read phase and a write phase.

Figure 3:
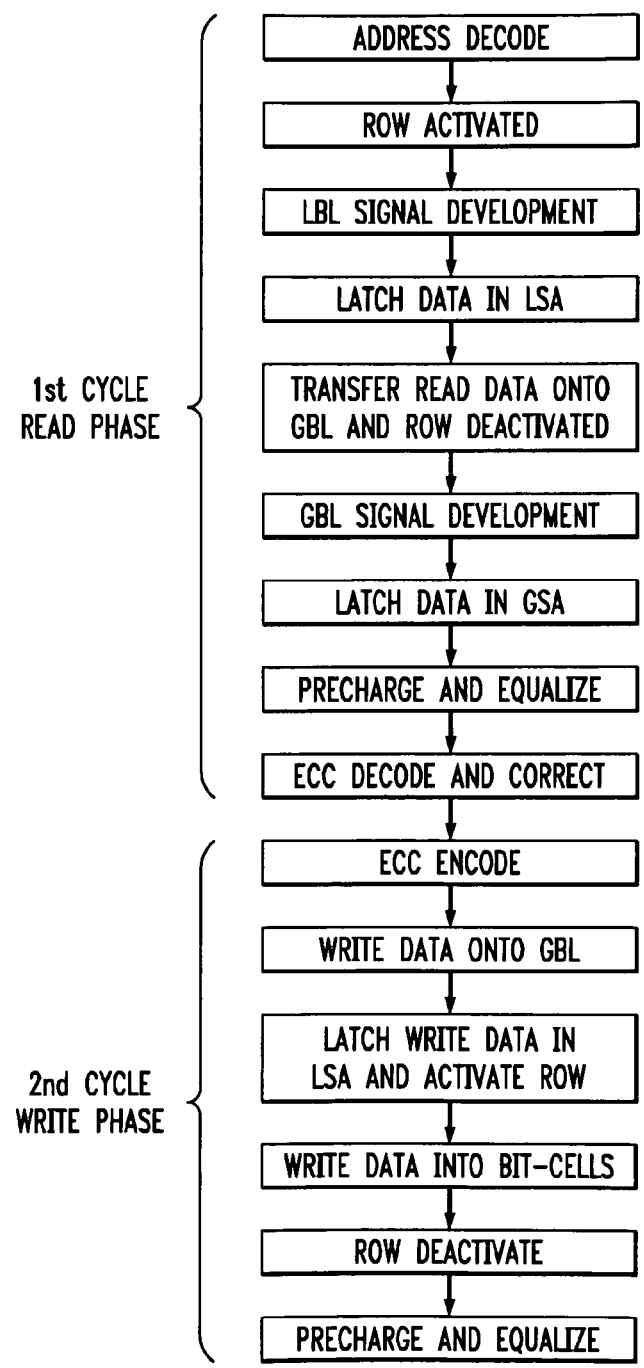
FIGS. 3 and 4 are flow diagrams of partial word write operations that may be implemented in the semiconductor memory device of FIG. 1.
Figure 4:
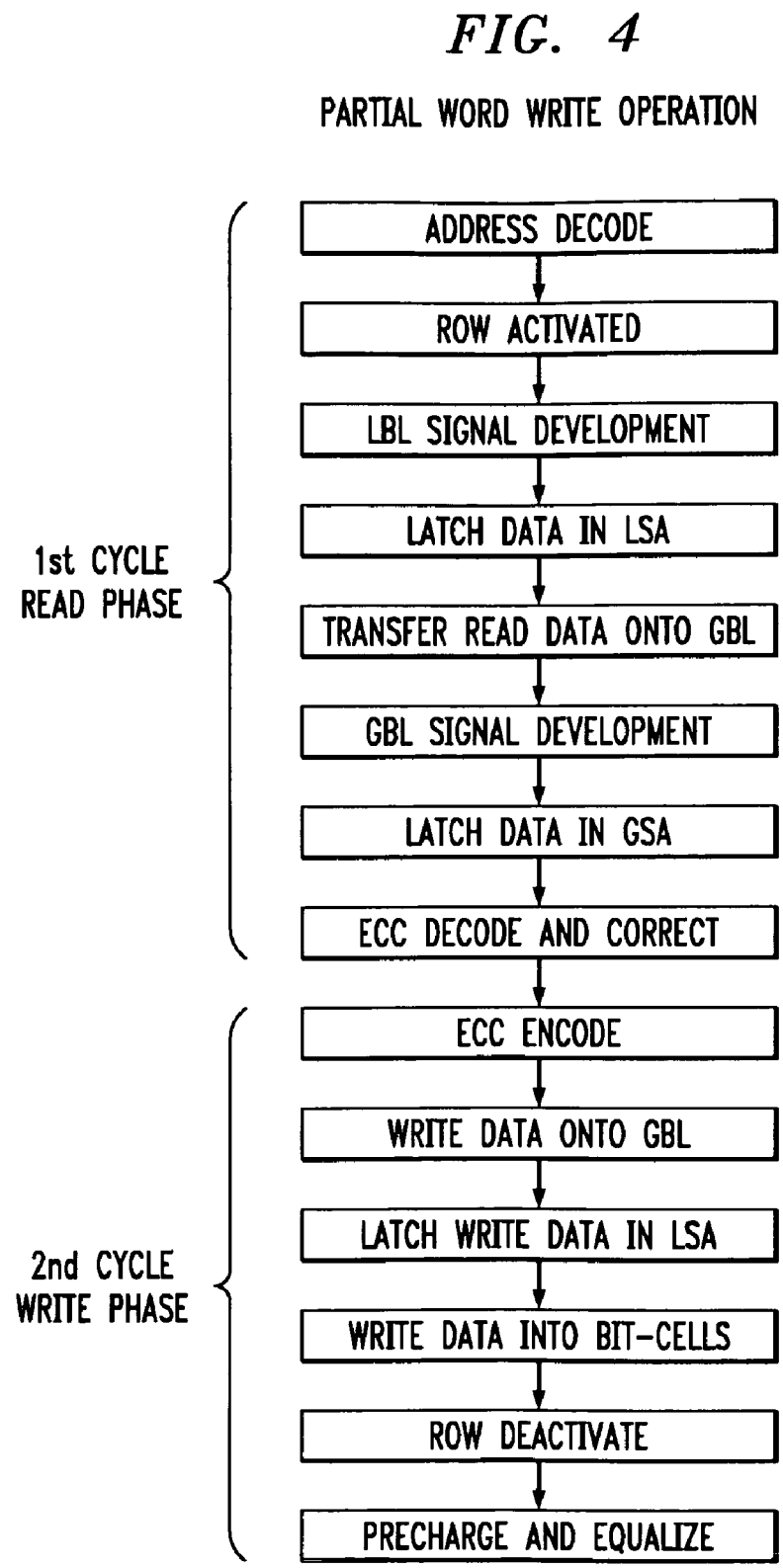

FIGS. 3 and 4 show two examples of partial word write operations that may be implemented in the memory device 100. Each includes a read phase and a write phase, these phases being associated with respective first and second clock cycles of the memory device. As previously described, the first cycle or read phase of a partial word write operation is a read and correction of the codeword that is to be partially rewritten. The second cycle or write phase is the calculation of the new ECC word and writing of the new codeword. In these figures, local and global bitlines are denoted LBL and GBL, respectively, and local and global sense amplifiers are denoted LSA and GSA, respectively.

Referring initially to FIG. 3, the read phase of the partial word write operation in this example comprises steps for address decode, row activated, LBL signal development, latch data in LSA, transfer read data onto GBL and row deactivated, GBL signal development, latch data in GSA, precharge and equalize, and ECC decode and correct. Precharge and equalize involves resetting the local bitlines, local sense amplifiers, global bitlines and global sense amplifiers to preset voltage levels. The write phase of the partial word write operation as shown in FIG. 3 comprises steps for ECC encode, write data onto GBL, latch write data in LSA and activate row, write data into bit-cells, row deactivate, and precharge and equalize.

The partial word write operation as shown in FIG. 4 is similar to that of FIG. 3, but the row is not deactivated at the end of the first cycle, but remains active into the second cycle, and precharge and equalize does not occur between the first and second cycles.

It is to be appreciated that the particular partial word write operations shown in FIGS. 3 and 4 are presented by way of illustrative example only. The present invention can be implemented using other types of partial word write operations that include read and write phases.

Figure 5:
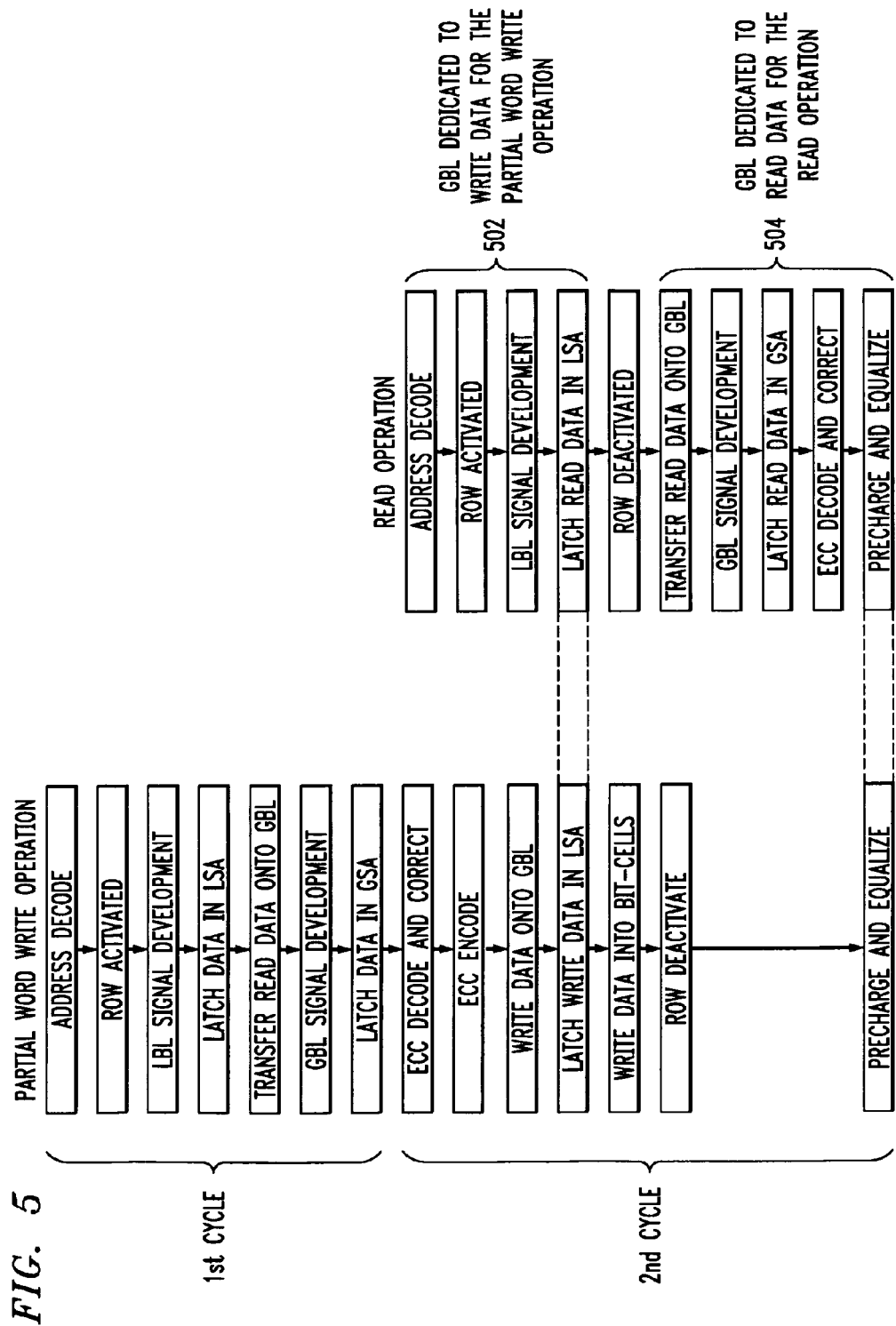
FIG. 5 shows a partial word write operation in which a write phase of the partial word write operation occurs in the same cycle as a read operation, in an illustrative embodiment of the invention.

FIG. 5 illustrates the manner in which the write phase of the partial word write operation of FIG. 4 can be performed in the same cycle as a read operation. As indicated previously, the global bitlines 120G of the memory array 102 are time multiplexed between the write phase of the partial word write operation and the read operation.

For the period of time corresponding to bracket 502, the global bitlines are dedicated to write data for the partial word write operation, as indicated in the figure. Thus, at the beginning of the second cycle, the write data is transferred onto the global bitlines and latched into the local sense amplifiers 135L within the sub-block 200 that is undergoing the partial word write. After the write data is latched in the local sense amplifiers, the write phase of the partial word write operation is released from access to the global bitlines and the associated global sense amplifiers 135G.

For the period of time corresponding to bracket 504, the global bitlines 120G are dedicated to read data for the read operation. Thus, the read operation has access to the global bitlines and the associated global sense amplifiers 135G during the second half of the second cycle. During the first half of the second cycle, the read operation transfers signals from the bit-cells onto the local bitlines 120L and latches these signals into the local sense amplifiers 135L awaiting availability of the global bitlines. When the global bitlines become available, data is transferred from the local sense amplifiers onto the global bitlines and into the global sense amplifiers. Data is then forwarded to the error correction circuitry 104.

FIG. 6 shows various sequences of operations that may occur in the memory device 100 in the illustrative embodiment. The sequences are shown as they would appear to a higher-level system which incorporates or otherwise utilizes the memory device. For certain cases, the internal correspondence within the memory device between particular operations or portions thereof and particular external cycles is also shown, with reference to external cycles denoted External Cycle 1, External Cycle 2, and so on.

Case 1 corresponds to the situation previously described in conjunction with FIG. 5, where a partial word write operation comprising a read phase and a write phase is followed by a read operation. It appears externally to the memory device as if the partial word write operation and the read operation occur in respective single consecutive cycles, although internally the write phase of the partial word write operation is multiplexed with the read operation in the manner illustrated in FIG. 5.

Case 2 corresponds to a partial word write operation followed by a write operation. A write operation cannot occur simultaneously with another write operation or write phase. For this reason, a write operation requested in the second cycle of a partial word write operation must be delayed until the following clock cycle, which is the third cycle in the present example. If a read operation has been requested for the third cycle, the write operation will occur simultaneously with the read operation during the third cycle. If a partial word write operation is requested for the third cycle, the write operation will occur simultaneously with the read phase of the partial word write operation. If another write operation is requested as the third cycle, this new write operation will be delayed until the fourth cycle.

Case 3 corresponds to a situation in which a partial word write operation is followed by another partial word write operation. Because the read phase is the first phase of a partial word write operation, a partial word write operation followed by another partial word write operation is very similar to a partial word write operation followed by a read operation. Thus, the situation is similar to that shown in FIG. 5, with the read operation being replaced with the read phase of the second partial word write.

Case 4 corresponds to a situation in which a partial word write operation is followed by a NOOP. Since a NOOP is a clock cycle with no read, write or partial word write operation requested, there is no conflict between a NOOP and any other cycle. A NOOP can occur simultaneously with the write phase of a partial word write operation.

The above-described illustrative embodiments provide a number of advantages relative to conventional practice. For example, multiplexing the global bitlines in the manner described allows the memory to perform partial word write operations without reducing the external cycle time specification of the memory device, or the data transfer rate between the memory device and a higher-level system. The speed at which partial word write operations can be performed in the memory device appears to the higher-level system as if it is the same as that for read operations or full word write operations.

A given memory device configured in accordance with the present invention may be implemented as a stand-alone memory device, for example, a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory of a microprocessor, central processing unit (CPU), digital signal processor (DSP), application-specific integrated circuit (ASIC), or other type of processor or integrated circuit device.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory arrays, error correction circuitry and associated logic and structural elements for implementing the described functionality. As a more particular example, input data may be applied directly to global bitlines rather than applied via respective global sense amplifiers. Thus, the particular circuitry used to implement signal distribution and control functions in the memory device may be altered in other embodiments. Also, the particular steps associated with a given partial word write operation can be varied to suit the needs of a given application. These and numerous other alternative embodiments within the scope of the following claims will be apparent to those skilled in the art.

What is claimed is:

1. A memory device comprising:
a memory array having a plurality of memory cells configured to store data;
said memory device being configured at least to perform a partial word write operation and a read operation, the partial word write operation comprising a read phase and a write phase, wherein the write phase of the partial word write operation occurs in the same clock cycle of the memory device as the read operation;
wherein bitlines of said memory array are time multiplexed within said clock cycle between the write phase of the partial word write operation and the read operation.

2. The memory device of claim 1 wherein the partial word write operation comprises at least one of a byte write operation and a bit write operation.

3. The memory device of claim 1 wherein the write phase of the partial word write operation occurs substantially simultaneously with the read operation.

4. The memory device of claim 1 wherein the read operation comprises a read phase of another partial word write operation.

5. The memory device of claim 1 wherein during a first portion of said clock cycle, write data to be written to a first one of the memory cells as part of the partial word write operation is carried by a given bitline of the memory array, and during a second portion of the clock cycle, read data read from a second one of the memory cells as part of the read operation is also carried by the given bitline.

6. The memory device of claim 1 wherein the memory cells are arranged in a plurality of sub-blocks having respective sets of local bitlines, said local bitlines being coupled to a set of global bitlines shared by the plurality of sub-blocks.

7. The memory device of claim 6 wherein the global bitlines are time multiplexed within said clock cycle between the write phase of the partial word write operation and the read operation.

8. The memory device of claim 7 wherein the time multiplexing of the global bitlines is configured such that in said clock cycle the global bitlines are first utilized to move write data from a data input to a first set of local sense amplifiers, coupled to respective ones of a first set of local bitlines of a first one of the sub-blocks, for latching as part of the write phase of the partial word write operation, and after the write data is latched in the first set of local sense amplifiers, the global bitlines are then utilized to move read data previously latched in a second set of local sense amplifiers, coupled to respective ones of a second set of local bit lines of a second one of the sub-blocks, to the error correction circuitry as part of the read operation.

9. The memory device of claim 6 wherein during a first portion of said clock cycle the global bitlines are dedicated for use with write data for the partial word write operation, and wherein during a second portion of the clock cycle the global bitlines are dedicated for use with read data for the read operation.

10. The memory device of claim 1 wherein the memory device comprises a stand-alone memory device.

11. The memory device of claim 1 wherein the memory device comprises an embedded memory device.

12. The memory device of claim 1, further comprising error correction circuitry coupled to the memory array and configured to process data retrieved from the memory array to generate corrected data.

13. An integrated circuit comprising:
a memory device; and
additional circuitry coupled to the memory device,
said memory device comprising:
a memory array having a plurality of memory cells configured to store data;
said memory device being configured at least to perform a partial word write operation and a read operation, the partial word write operation comprising a read phase and a write phase, wherein the write phase of the partial word write operation occurs in the same clock cycle of the memory device as the read operation;
wherein bitlines of said memory array are time multiplexed within said clock cycle between the write phase of the partial word write operation and the read operation.

14. The integrated circuit of claim 13 wherein said additional circuitry comprises a processor.

15. The integrated circuit of claim 13 wherein during a first portion of said clock cycle, write data to be written to a first one of the memory cells as part of the partial word write operation is carried by a given bitline of the memory array, and during a second portion of the clock cycle, read data read from a second one of the memory cells as part of the read operation is also carried by the given bitline.

16. The integrated circuit of claim 13, wherein the memory device further comprises error correction circuitry coupled to the memory array and configured to process data retrieved from the memory array to generate corrected data.

17. A method for performing operations in a memory device comprising a memory array having a plurality of memory cells configured to store data, the method comprising the steps of:
performing a partial word write operation comprising a read phase and a write phase; and
performing a read operation;
wherein the write phase of the partial word write operation occurs in the same clock cycle of the memory device as the read operation; and
wherein the performing steps further comprise the step of time multiplexing bitlines of said memory array within said clock cycle between the write phase of the partial word write operation and the read operation.

18. The method of claim 17 wherein during a first portion of said clock cycle, write data to be written to a first one of the memory cells as part of the partial word write operation is carried by a given bitline of the memory array, and during a second portion of the clock cycle, read data read from a second one of the memory cells as part of the read operation is also carried by the given bitline.

19. The method of claim 17 wherein the memory cells are arranged in a plurality of sub-blocks having respective sets of local bitlines, said local bitlines being coupled to a set of global bitlines shared by the plurality of sub-blocks, and further wherein the global bitlines are time multiplexed within said clock cycle between the write phase of the partial word write operation and the read operation.

20. The method of claim 17, wherein the memory device further comprises error correction circuitry coupled to the memory array and configured to process data retrieved from the memory array to generate corrected data.

21. A memory device comprising:
a memory array having a plurality of memory cells configured to store data;
said memory device being configured to perform at least a write operation and a read operation;
wherein the memory device comprises a plurality of bitlines associated with the memory cells of the array, at least a given one of said bitlines being used to transfer write data during one portion of a given clock cycle of the memory device and at least the given one of said bitlines being used to transfer read data during a different portion of the given clock cycle;
wherein the write operation comprises a partial word write operation; and
wherein the partial word write operation comprises a read phase and a write phase, and wherein the plurality of bitlines are time multiplexed within the given clock cycle between the write phase of the partial word write operation and the read operation.

22. The memory device of claim 21 wherein the plurality of bitlines are time multiplexed within the given clock cycle between the write operation and the read operation.

23. A method for performing operations in a memory device comprising a memory array having a plurality of memory cells configured to store data, said memory device being configured to perform at least a write operation and a read operation, the method comprising the steps of:
utilizing at least a given one of a plurality of bitlines associated with the memory cells of the array to transfer write data during one portion of a given clock cycle of the memory device; and
utilizing at least the given one of said plurality of bitlines to transfer read data during a different portion of the given clock cycle;
wherein the write operation comprises a partial word write operation;
wherein the partial word write operation comprises a read phase and a write phase, and wherein the utilizing steps further comprise the step of time multiplexing the plurality of bitlines within the given clock cycle between the write phase of the partial word write operation and the read operation.

24. The method of claim 23 wherein the utilizing steps further comprise the step of time multiplexing the plurality of bitlines within the given clock cycle between the write operation and the read operation.

* * * * *